United States Patent
Nakamura

(10) Patent No.: US 7,749,687 B2
(45) Date of Patent: Jul. 6, 2010

(54) PATTERN FORMING METHOD USED IN SEMICONDUCTOR DEVICE MANUFACTURING AND METHOD OF MANUFACTURING SEMICONDUCTOR DEVICE

(75) Inventor: Hiroko Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 648 days.

(21) Appl. No.: 11/798,724

(22) Filed: May 16, 2007

(65) Prior Publication Data

US 2007/0269746 A1 Nov. 22, 2007

(30) Foreign Application Priority Data

May 17, 2006 (JP) ............... 2006-137982

(51) Int. Cl.
*G03C 5/00* (2006.01)
(52) U.S. Cl. ............... 430/312; 430/313; 430/314; 430/315; 430/328; 430/394
(58) Field of Classification Search ............... 430/312, 430/313, 314, 315, 328, 394
See application file for complete search history.

(56) References Cited

U.S. PATENT DOCUMENTS 6,664,011 B2 12/2003 Lin et al.

2005/0196684 A1 9/2005 Nakamura et al.

FOREIGN PATENT DOCUMENTS

JP 2001-358061 12/2001

OTHER PUBLICATIONS

Chang, et al., "Low Proximity Contact Holes Formation by Using Double Exposure Technology (DET)", Proceeding of SPIE, vol. 5040, pp. 1241-1246, (2003).

*Primary Examiner*—Christopher G Young
(74) *Attorney, Agent, or Firm*—Finnegan, Henderson, Farabow, Garrett & Dunner, L.L.P.

(57) ABSTRACT

A method of forming a pattern on a photosensitive resin film in lithography, a method of forming a pattern for a semiconductor device, and a method of manufacturing a semiconductor device using the patterned film are disclosed. In an aspect of the invention, there is provided a method of forming a pattern on a photosensitive resin film, comprising forming a processing-object film above a semiconductor substrate, forming a first patterned photosensitive resin layer on the processing-object film, implanting ions into the first patterned photosensitive resin layer, the sum (Rp+3dRp) of a projected range (Rp) for the ions in the first photosensitive resin layer and three times a standard deviation (dRp) of the projected range being greater than a thickness of the first patterned photosensitive resin layer, and forming a second patterned photosensitive resin layer on the ion-implanted first patterned photosensitive resin layer.

20 Claims, 6 Drawing Sheets

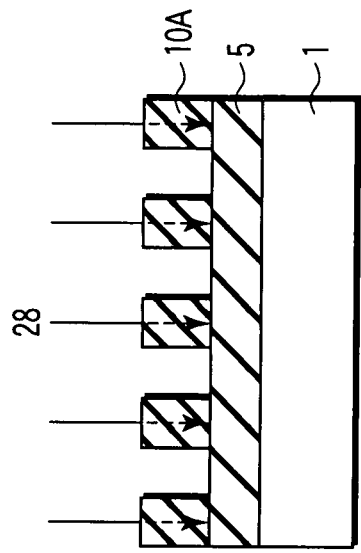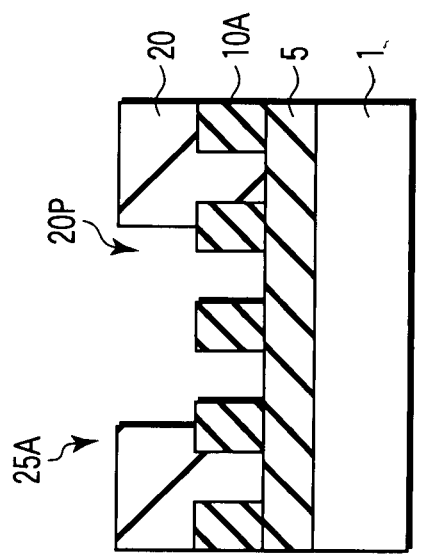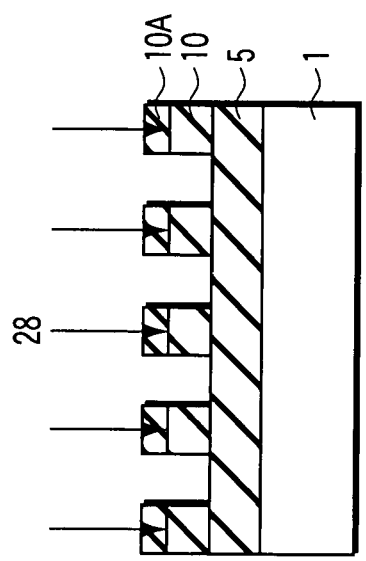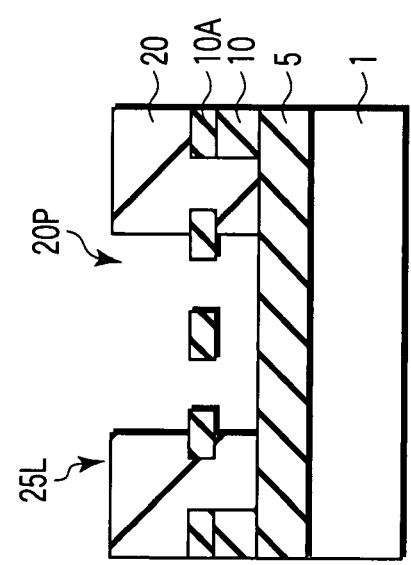

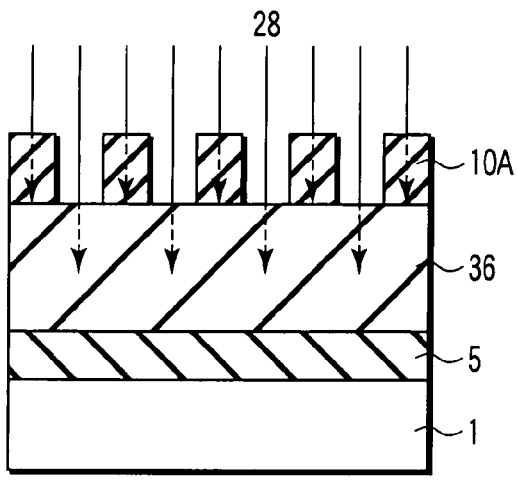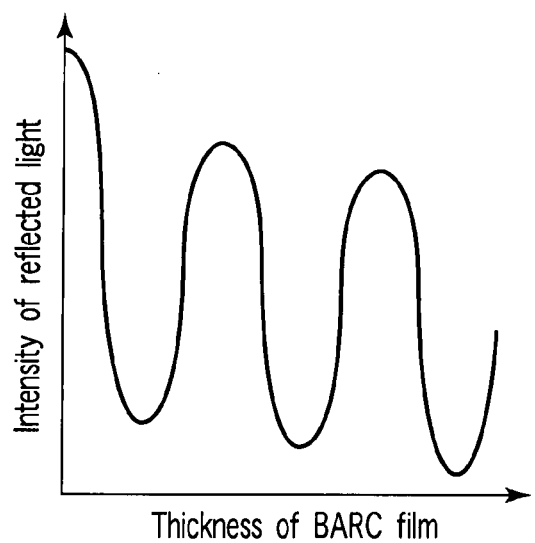
FIG. 10A  FIG. 10B
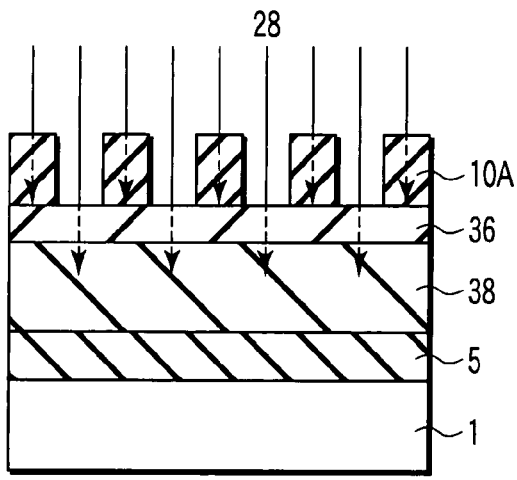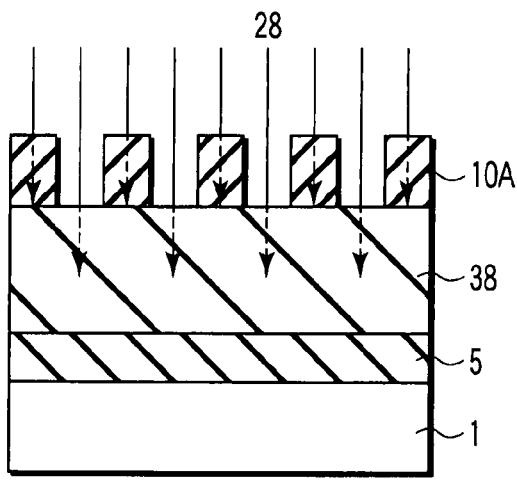
FIG. 11A  FIG. 11B
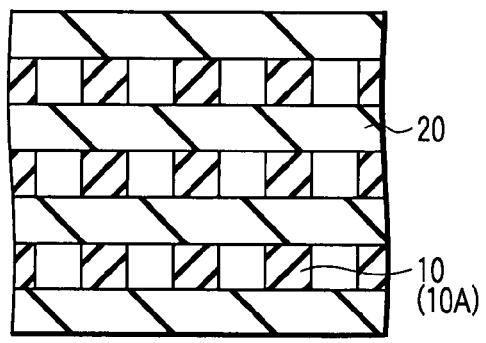
FIG. 12

US 7,749,687 B2

PATTERN FORMING METHOD USED IN SEMICONDUCTOR DEVICE MANUFACTURING AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2006-137982, filed May 17, 2006, the entire contents of which are incorporated herein by reference.

BACKGROUND OF THE INVENTION

1. Field of the Invention

The present invention relates to a method of manufacturing a semiconductor device, and more particularly to a method of forming a pattern on a photosensitive resin film in lithography, a method of forming a pattern for a semiconductor device, and a method of manufacturing a semiconductor device using the patterned film.

2. Description of the Related Art

In accordance with the progress of miniaturization of semiconductor devices, methods using, as etching masks, a plurality of patterned photosensitive resin layers stacked on each other have been proposed. In this method, exposure/development is performed twice or more. This can enhance resolution and margin for forming a desired fine pattern on a photosensitive resin film, compared to the case of forming a pattern by one-time execution of exposure/development. The pack-and-cover (PAC) process disclosed in U.S. Pat. No. 6,664,011B2 is one example of the methods.

When a plurality of patterned photosensitive resin layers are stacked by forming an upper photosensitive resin layer on a lower patterned photosensitive resin layer, the lower patterned photosensitive resin layer may be dissolved by a solvent contained in the upper photosensitive resin layer. To avoid this phenomena from occurring, a method has been proposed, in which after a pattern is formed of a lower photosensitive resin layer, the lower photosensitive resin layer is made insoluble before an upper photosensitive resin layer is formed thereon (see, for example, C. Chang et. al.; "Low Proximity Contact-holes Formation by Using Double Exposure Technology (DET)", Proc. of SPIE, Vol. 5040, pp. 1241-1246, 2003).

As one method for making a lower photosensitive resin layer insoluble, ion implantation is known in the art. The above-mentioned publication discloses a technique of implanting ions into a lower photosensitive resin layer to harden its surface, and performing the above-mentioned PAC process, thereby forming a fine random contact-hole pattern that cannot be achieved by one-layer lithography process.

BRIEF SUMMARY OF THE INVENTION

In accordance with an aspect of the invention, there is provided a method of forming a pattern on a photosensitive resin film, comprising: forming a processing-object film above a semiconductor substrate; forming a first patterned photosensitive resin layer on the processing-object film; implanting ions into the first patterned photosensitive resin layer, the sum (Rp+3dRp) of a projected range (Rp) for the ions in the first photosensitive resin layer and three times a standard deviation (dRp) of the projected range being greater than a thickness of the first patterned photosensitive resin layer; and forming a second patterned photosensitive resin layer on the ion-implanted first patterned photosensitive resin layer.

In accordance with another aspect of the invention, there is provided a method of forming a pattern on a photosensitive resin film, comprising: forming a processing-object film above a semiconductor substrate; forming an ion-blocking film on the processing-object film; forming a first patterned photosensitive resin layer on the ion-blocking film; implanting ions into the first patterned photosensitive resin layer and the ion-blocking film, the sum (Rp+3dRp) of a projected range (Rp) for the ions in the first photosensitive resin layer and three times a standard deviation (dRp) of the projected range being greater than a thickness of the first patterned photosensitive resin layer; and forming a second patterned photosensitive resin layer on the ion-implanted first patterned photosensitive resin layer, wherein the ion-blocking film has a thickness with which the implanted ions do not reach the processing-object film.

In accordance with yet another aspect of the invention there is provided a method of forming a pattern for a semiconductor device comprising: forming a processing-object film above a semiconductor substrate; forming a first patterned photosensitive resin layer on the processing-object film; implanting ions into the first patterned photosensitive resin layer, the sum (Rp+3dRp) of a projected range (Rp) for the ions in the first photosensitive resin layer and three times a standard deviation (dRp) of the projected range being greater than a thickness of the first patterned photosensitive resin layer; forming a second patterned photosensitive resin layer on the ion-implanted first patterned photosensitive resin layer; and patterning the processing-object film using the first and second patterned photosensitive resin layers as masks.

In accordance with further aspect of the invention, there is provided a method of manufacturing a semiconductor device, comprising: forming functional elements of the semiconductor device on and/or above a semiconductor substrate; forming a processing-object film over the functional elements; forming a first patterned photosensitive resin layer on the processing-object film; implanting ions into the first patterned photosensitive resin layer, the sum (Rp+3dRp) of a projected range (Rp) for the ions in the first photosensitive resin layer and three times a standard deviation (dRp) of the projected range being greater than a thickness of the first patterned photosensitive resin layer; forming a second patterned photosensitive resin layer on the ion-implanted first patterned photosensitive resin layer; forming holes and/or trenches in the processing-object film using the first and second patterned photosensitive resin layers as masks, the holes and/or trenches reaching the functional elements; and forming conductive materials in the holes and/or trenches, thereby electrically connecting the conductive materials to the functional elements.

BRIEF DESCRIPTION OF THE SEVERAL VIEWS OF THE DRAWING

FIGS. 5A to 5D are sectional views explaining the relationship between the acceleration voltage of ion implantation and the patterned photosensitive resin film made insoluble;

FIG. 10A is a sectional view of an example of a patterned photosensitive resin film according to modification 1 of the present invention;

FIG. 10B is a graph illustrating the relationship between the intensity of reflected light and the thickness of the BARC film of the patterned photosensitive resin film according to modification 1;

FIG. 11A is a sectional view of an example of a patterned photosensitive resin film according to modification 2 of the present invention;

FIG. 11B is a sectional view of an example of a patterned photosensitive resin film according to modification 3 of the present invention; and FIG. 12 is a plan view explaining a method of forming a pattern on a photosensitive resin film according to modification 4 of the present invention.

DETAILED DESCRIPTION OF THE INVENTION

Figure 1A:
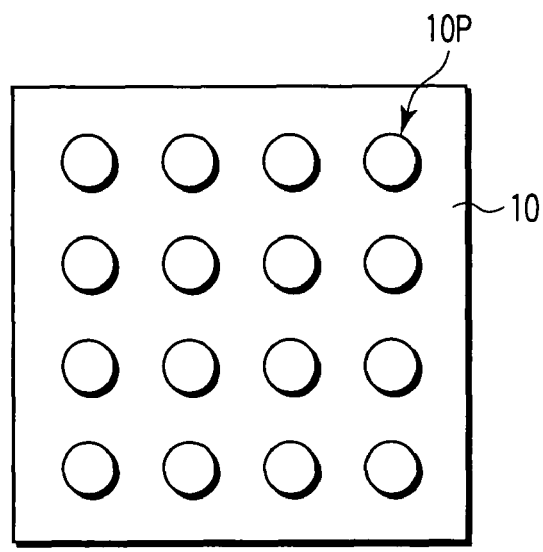
FIGS. 1A to 1C are views explaining an example of a method of forming a pattern on a photosensitive resin film using a two-layer photosensitive resin film, according to a first embodiment of the present invention.

To stably obtain a patterned photosensitive resin film (e.g., a photoresist film) in a process using multiple photosensitive resin layers (e.g., resist layers) as in the previously mentioned publication of C. Chang et al., it is insufficient implanting ions merely. When ion implantation is performed after a pattern of a lower photosensitive resin layer is formed, if the acceleration voltage applied is too low and the depth of implanted ions is too shallow, only a surface region of the lower photosensitive resin layer is made insoluble. In such a case, the inventor of the present application found, the lower portion of the lower photosensitive resin layer is dissolved during, for example, coating and development of an upper photosensitive resin layer, and accordingly the resultant patterned photosensitive resin film has a structure in which the surface of the lower photosensitive resin layer is made insoluble and remains, but its bottom portion is hollow. The inventor found that the conditions of ion implantations disclosed in the publication of C. Chang et al. result in this structure.

When an processing-object film (a film to be processed), such as a silicon oxide film ($SiO_2$ film), is etched using a patterned two-layer photosensitive resin film as a mask, the photosensitive resin film itself is also etched along with the processing-object film. Accordingly, it was found that when the above-mentioned patterned photosensitive resin film with hollow is used as the mask, the mask resin film disappears during etching, and hence a desired pattern cannot be obtained.

It was also found that if ion implantation is performed under conditions that cause the lower portion of the patterned photosensitive resin film to be hollow, the lower portion of a photosensitive resin film with an isolated-line pattern or with a fine line-and-space pattern dissolves during development, and therefore that the resultant patterned photosensitive resin film peels off after development.

Embodiments of the present invention are directed to a method of forming a pattern on a photosensitive resin film using multiple photosensitive resin layers, a method of forming a pattern for a semiconductor device using the patterned photosensitive resin film, and a method of manufacturing a semiconductor device.

According to an embodiment of the present invention, when a pattern is formed using multiple photosensitive resin layers (e.g., two layers), ions are implanted into the lower photosensitive resin layer under appropriate conditions after the lower photosensitive resin layer is patterned and before an upper photosensitive resin layer is formed, thereby causing the lower photosensitive resin layer to be insoluble over the entire thickness. In such a manner, there is provided a method of forming a fine pattern, such as a contact-hole pattern and a trench pattern, on the photosensitive resin film. There is also provided a method of forming a pattern for a semiconductor device using the patterned photosensitive resin film and a method of manufacturing a semiconductor device.

The embodiments of the present invention will be described below with reference to the accompanying drawings. Throughout the drawings, corresponding portions are denoted by corresponding reference numerals. Each of the following embodiments is illustrated by way of example, however, the present invention can be variously modified and implemented without departing from the spirit of the present invention.

First Embodiment

A first embodiment of the invention provides a method of forming a pattern on a photosensitive resin film, in which ions are implanted into the photosensitive resin film under a condition implanting ions into the resin film over the entire thickness, thereby making the entire photosensitive resin film insoluble. It also provides a method of forming a pattern for a semiconductor device using the patterned photosensitive resin film, and a method of manufacturing a semiconductor device. The first embodiment will now be described forming of fine contact-hole patterns using a pack-and-cover (PAC) process as an example. It is to be noted that fine line patterns, such as trenches and fine wiring lines, can also patterned by the method of the embodiment.

Figure 1B:
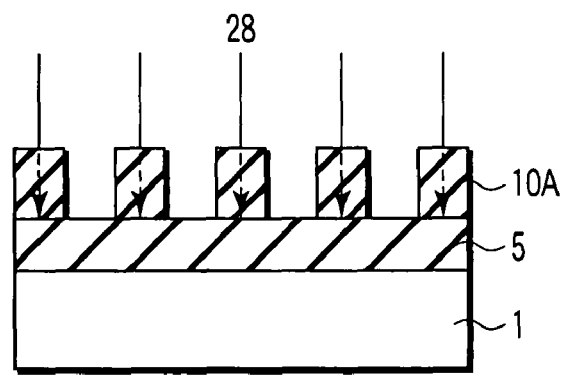
Figure 1C:
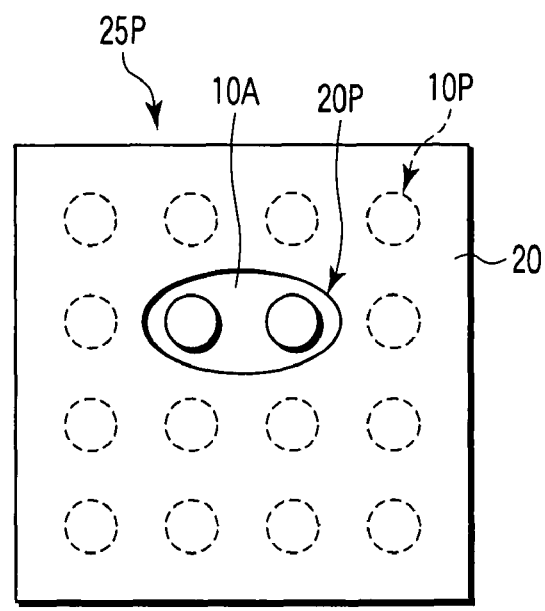

Referring to FIGS. 1A to 1C, the embodiment will be described. In the embodiment, as shown in FIG. 1A, a dense periodic-pattern 10P, such as contact-holes arranged in a matrix, formed of a first photosensitive resin layer 10 is formed. As shown in the sectional view of FIG. 1B, after the first photosensitive resin layer 10 with the contact-hole pattern 10P is formed, ions 28 are implanted into the first photosensitive resin layer 10 over the entire thickness, as indicated by arrows. As a result, the first photosensitive resin layer 10 is converted into an insoluble first photosensitive resin layer 10A over the entire thickness. Accordingly, when a second photosensitive resin layer is coated on the first patterned photosensitive resin layer 10A and developed, the first photosensitive resin layer 10A with the contact-hole pattern 10P is insoluble over the entire film thickness. Further, as shown in FIG. 1C, a selective opening-pattern 20P formed of the second photosensitive resin layer 20 is provided on the first photosensitive resin layer 10A, thereby producing a two-layer patterned photosensitive resin film 25P having only desired contact-holes opened. It is to be noted that there are provided various functional elements of the semiconductor device, such as MOS transistors, capacitors and wirings, on/above a semiconductor substrate 1, which are not shown in FIG. 1B. Further, a processing-object film 5 is formed to cover at least one of the functional elements.

To convert the first photosensitive resin layer 10 into the insoluble photosensitive resin layer 10A over the entire thickness, it is necessary to appropriately adjust the ion implantation conditions. A description will be given of setting of ion implantation conditions.

Figure 2:
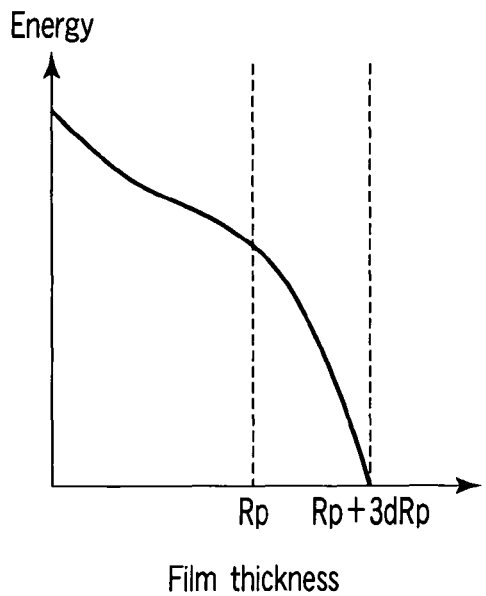
FIG. 2 is a graph explaining total amount of energy transferred from implanted ions to a photosensitive resin film.
Figure 3:
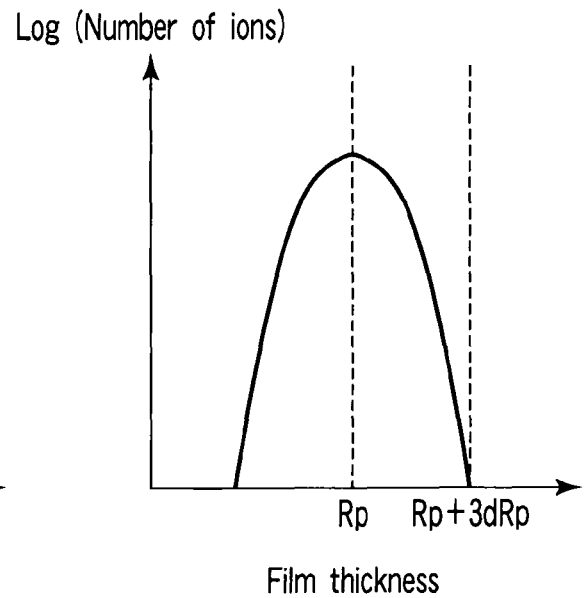
FIG. 3 is a graph illustrating a depth distribution of implanted ions.

In the embodiment, assume, for example, that the first photosensitive resin layer 10 has a thickness of 150 nm, and the ions implanted are $Ar^+$ ions. Inert gas ions, such as $He^+$ ions, $Xe^+$ ions, and $Kr^+$ ions, are preferable as the ions implanted other than $Ar^+$ ions. These ions are not liable to remain in the photosensitive resin film, and cause no problem even if they remain in the film. When $Ar^+$ ions are implanted into the photosensitive resin film, the $Ar^+$ ions lose their energy as the depth of implanted ions in the resin film increases, as shown in FIG. 2. In general, the range of projection is represented by Rp, and it means the depth at which the number of implanted ions becomes maximal. The standard deviation of the projected range is represented by dRp. The implanted ions lose their energy by the nuclear stopping power due to collision of the implanted ions and nuclei of constituting atoms of the photosensitive resin film, and by the electronic stopping power due to electrical interaction between the implanted ions and an electric field of the electrons of the atoms. As a result, the $Ar^+$ ions distribute in the depth of the photosensitive resin film as shown in FIG. 3. The depth at which the number of the implanted ions becomes maximal is the projected range, Rp. Most ions (99% or more ions) are distributed within the depth acquired by the sum (Rp+3dRp) of the projected range (Rp) and three times the standard deviation (dRp) of the projected range.

Figure 4:
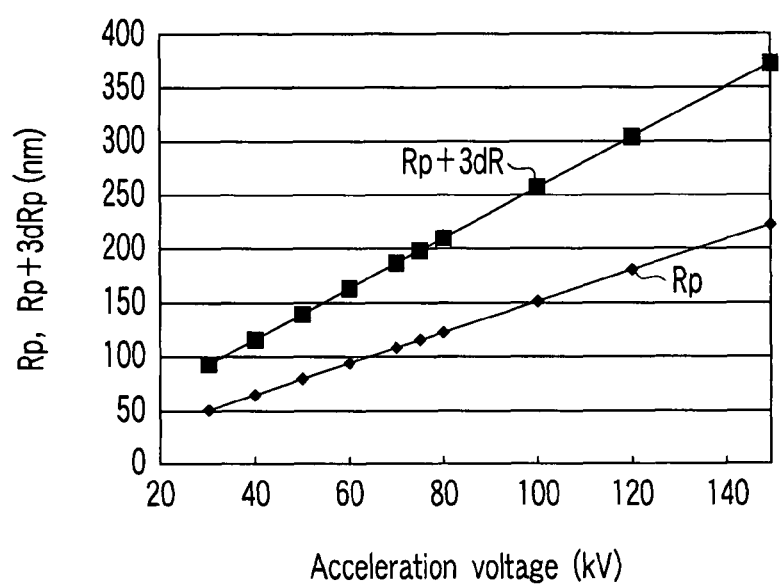
FIG. 4 is a graph illustrating the projected range (Rp) and the sum (Rp+3dRp) of the projected range and three times of its standard deviation for the implanted argon ions in a photosensitive resin film as a function of acceleration voltage, according to the first embodiment.

The projected range and its standard deviation vary depending upon ion species, an acceleration voltage applied to ions, a material to be implanted with ions, etc. FIG. 4 shows relationship between the acceleration voltage and the projected range (Rp) and the sum (Rp+3dRp) of the projected range and three times the standard deviation of the projected range, when $Ar^+$ ions are implanted into a photosensitive resin film. As is evident from FIG. 4, the higher the acceleration voltage, the greater the projected range (Rp) and the standard deviation (dRp) of the projected range. For instance, when the acceleration voltage is 30 KV, Rp is 52 nm and Rp+3dRp is 94 nm, and when the acceleration voltage is 100 KV, Rp is 153 nm and Rp+3dRp is 258 nm.

Referring to the sectional views of FIGS. 5A to 5D, a description will be given of the relationship between the acceleration voltage used for ion implantation and the insoluble patterned photosensitive resin film. FIG. 5A shows a first photosensitive resin layer 10+10A when the acceleration voltage is low, and FIG. 5B shows a patterned photosensitive resin film 25L formed of two photosensitive resin layers when the acceleration voltage is low. FIG. 5C shows a first photosensitive resin layer 10A when the acceleration voltage is high, and FIG. 5D shows a patterned photosensitive resin film 25A formed of two photosensitive resin layers when the acceleration voltage is high. In these figures, arrows 28 denote implanted ions. Assume that the first photosensitive resin layer 10 has a thickness of 150 nm. As shown in FIG. 5A, when the acceleration voltage is low, e.g., 30 KV, $Ar^+$ ions 28 are implanted into only an upper portion of the first photosensitive resin layer 10, but not into the lower portion thereof. Accordingly, the upper portion of the first photosensitive resin layer 10 is converted into the insoluble photosensitive resin layer 10A, whereas the lower portion is not made insoluble. Therefore, during forming of a second patterned photosensitive resin layer 20P with selective opening pattern as shown in FIG. 5B, the lower portion of the first photosensitive resin layer 10 is dissolved and removed. After forming the second patterned photosensitive resin layer 20 with a selective opening pattern 20P, the processing-object film 5 is etched using, as a mask, the patterned photosensitive resin film 25L formed of the first and second photosensitive resin layers 10+10A and 20. At this time, the photosensitive resin layer 10A at the opening is also etched, and hence part of or the entire patterned photosensitive resin film 25L may disappear during the etching of the processing-object film 5 if a sufficient thickness of the photosensitive resin layer 25L does not remain before the etching, whereby a desired pattern may not be obtained.

In contrast, if the acceleration voltage is as high as 100 KV or more, the $Ar^+$ ions 28 reach the bottom of the first photosensitive resin layer 10 as shown in FIG. 5C. As a result, the first photosensitive resin layer 10 is converted into the insoluble photosensitive resin layer 10A over the entire thickness. Thus, a patterned photosensitive resin film 25A including the insoluble first photosensitive resin layer 10A is formed as shown in FIG. 5D. When the processing-object film 5 is etched and patterned using the patterned photosensitive resin film 25A as a mask, the patterned photosensitive resin film 25A does not disappear during etching of the processing-object film 5, and hence a desired pattern is formed in the processing-object film 5.

Two mechanisms can be considered concerning how the first photosensitive resin layer 10 is removed during forming the second patterned photosensitive resin layer 20 with the selective opening pattern 20P when the thickness of the insoluble layer 10A is insufficient. As one mechanism, the first photosensitive resin layer 10 is dissolved by the solvent of the second photosensitive resin layer 20. In this case, when the second photosensitive resin layer 20 is coated on the first patterned photosensitive resin layer 10, the first patterned photosensitive resin layer 10 is dissolved by the solvent of the second photosensitive resin layer 20. After that, the second photosensitive resin layer 20 is subjected to exposure and development. At this time, the exposed portions of the second photosensitive resin layer 20 are removed, and the exposed portions of the first patterned photosensitive resin layer 10, in which ions are insufficiently implanted, are also removed.

As another mechanism, the first photosensitive resin layer 10 is also exposed during the exposure of the second photosensitive resin layer 20. In this case, the portions of the first photosensitive resin layer 10A, in which ions are implanted deep enough, are made sufficiently insoluble as a result of cross-linking reaction in the resin film, and hence are not dissolved by a developer during development of the second photosensitive resin layer 20. In contrast, the portions, in which ions are not deeply implanted enough, are dissolved by the developer. As a result, the lower portions of the first photosensitive resin layer 10 are removed.

In any one of the mechanisms, cross-linking reaction is accelerated by ion implantation in the first photosensitive resin layer 10, whereby the resin layer 10 is converted into the insoluble photosensitive resin layer 10A that is not dissolved by the developer or solvent of the second photosensitive resin layer 20.

A description will now be given of how to determine the ion implantation conditions for converting the first photosensitive resin layer 10 into a photosensitive resin layer 10A made insoluble over a desired thickness.

The ions implanted into the photosensitive resin film are gradually reducing their speed as loosing their energy, and finally stop. The lost energy is actually transferred from the ions to the photosensitive resin film and used to make the photosensitive resin film insoluble. Energy is transferred to the photosensitive resin film in two processes, i.e., a process of energy transfer due to collision of the implanted ions and the nuclei of atoms constituting the photosensitive resin film, and another process of energy transfer due to interaction of the electric field of each implanted ion and that of electrons of each atom. The thickness of the insoluble portion of the photosensitive resin film is determined by an amount of energy to convert the photosensitive resin film insoluble within the overall transferred energy, i.e., an amount of energy used for cross-linking reaction of the photosensitive resin film.

The amount of transferred energy per unit depth and per one ion due to nuclei collision becomes a maximum at a position slightly shallower than the projected range (Rp). On the other hand, in the energy range in the embodiment, the transfer energy per unit depth and per one ion due to interaction with a charged particle becomes greater as the energy of each ion is increased. The computation of the latter energy requires consideration of the process of the ion losing its energy and the electronic structure of each atom in the resin film. Therefore it is difficult to estimate the exact energy transferred to the photosensitive resin film. But at least the following can be said:

To cause energy transfer, ions must pass the photosensitive resin film. Since in a surface portion shallower than the projected range (Rp) for ions, a large number of ions passes, each ion has a large energy, and a great energy transfer occurs when each ion stops, a large amount of energy is transferred to the surface portion.

At the depth ranging from the projected range for each ion to the sum of the projected range and three times the standard deviation of the projected range, i.e., ranging from Rp to Rp+3dRp, the number of passing ions drastically decreases, and the energy of each ion decreases. Therefore, the amount of energy transferred to the photosensitive resin film drastically decreases.

Further, at the depth deeper than the sum of the projected range and three times the standard deviation of the projected range, i.e., deeper than Rp+3dRp, almost no ions pass, and hence the amount of energy transferred is extremely small.

FIG. 2 shows the total transferred energy to a photosensitive resin film estimated based on the above description. Although variations occur depending upon the ion species, photosensitive resin film material, acceleration voltage, energy is qualitatively transferred to the photosensitive resin film as shown in FIG. 2.

When a photosensitive resin film of a certain thickness is entirely converted into an insoluble photosensitive resin film, it is necessary to impart a critical energy or higher energy to the photosensitive resin film. The energy imparted to the photosensitive resin film can be controlled not only by ion acceleration voltage but also by dose of implanted ions. However, in a photosensitive resin film having a thickness thicker than the sum of the projected range and three times the standard deviation of the projected range, i.e., Rp+3dRp, it is necessary to implant an extremely large number of ions in order to convert the entire photosensitive resin film into the insoluble one. Therefore, it is preferable that ion implantation conditions are set to make Rp+3dRp greater than the thickness of the photosensitive resin film. Further, in light of the fact that the amount of energy transferred drastically decreases at the depth between Rp and Rp+3dRp, it is more preferable, in consideration of the throughput, that ion implantation conditions be set to make the projected range Rp greater than the thickness of the photosensitive resin film.

Experiments were conducted, in which the dose of $Ar^+$ ions was set to a minimum value that enables a totally insoluble photosensitive resin film to be obtained, and ion implantation was executed at different acceleration voltages, thereby measuring the thicknesses of insoluble portions of the resultant photosensitive resin films. As a result, it was confirmed that the photosensitive resin film was converted into an insoluble photosensitive resin film up to a depth near the projected range Rp for the ions.

The projected range for implanted ions can be controlled by selecting the acceleration voltage applied to the ions, the species of the ions (mass and charge amount), and the material (component elements) of a photosensitive resin film into which the ions are implanted.

Figure 6:
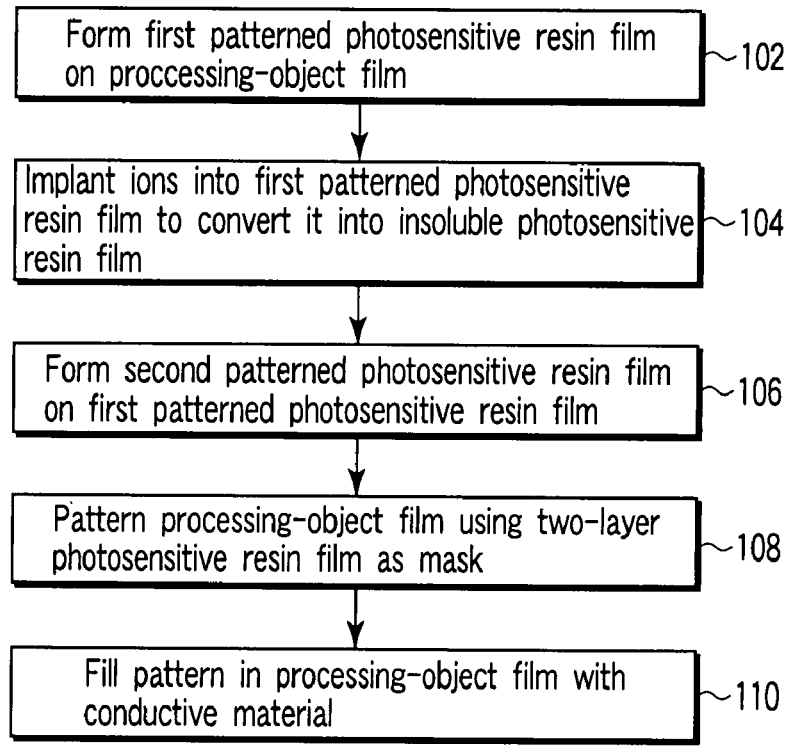
FIG. 6 is a flowchart explaining a method of forming a pattern for a semiconductor device using a patterned photosensitive resin film, and a method of manufacturing a semiconductor device according to the first embodiment.

Referring to the flowchart of FIG. 6, a description will be given of a method of forming a pattern for a semiconductor device on a processing-object film 5, using the above-described patterned two photosensitive resin layers 25A, and a method of manufacturing a semiconductor device.

In step 102, a processing-object film 5, e.g., a silicon oxide ($SiO_2$) film and a silicon nitride ($Si_3N_4$) film, is formed to cover at least one of the functional elements of the semiconductor device provided on the semiconductor substrate 1. The functional elements include, for example, MOS transistors, capacitors, and wirings. On the processing-object film 5, a first photosensitive resin layer 10 with a pattern 10P, e.g., fine contact-holes arranged in a matrix and fine trenches arranged in parallel, is formed. The thickness of the first patterned photosensitive resin layer 10P is, for example, 150 nm.

In the next step 104, $Ar^+$ ions are implanted into the first patterned photosensitive resin layer 10P with an acceleration voltage of 100 KV. When the acceleration voltage is 100 KV, the projected range (Rp) for $Ar^+$ ions in the photosensitive resin film employed in the embodiment is 152 nm, as shown in FIG. 4. Accordingly, the entire thickness of the first photosensitive resin layer 10 is within the projected range (Rp) for $Ar^+$ ions, and $Ar^+$ ions having sufficient energy are spread over the entire photosensitive resin layer. As a result, the first photosensitive resin layer 10 is converted into an insoluble photosensitive resin layer 10A over the entire thickness.

In step 106, a second photosensitive resin layer 20 with selective opening-pattern 20P is formed on the first patterned photosensitive resin layer 10P, thereby exposing only patterns, such as contact-holes and trenches, at desired positions. When the second patterned photosensitive resin layer 20P is formed, the first patterned photosensitive resin layer 10P is prevented from being dissolved, since the first photosensitive resin layer 10 is already doped with $Ar^+$ ions over the entire thickness and converted into the insoluble photosensitive resin layer 10A entirely.

In step 108, the processing-object film 5 is etched, using the two-layer patterned photosensitive resin film 25A thus formed as a mask, thereby forming desired patterns of, e.g., contact-holes and trenches, in the processing-object film 5. During this etching step, the patterned photosensitive resin film 25A is prevented from disappearing during etching, since the first patterned photosensitive resin layer 10P is converted into the insoluble photosensitive resin layer 10A. Accordingly, the object film 5 of the semiconductor device can be desirably patterned. The contact-holes are formed to reach functional elements of the semiconductor device, such as gate electrodes and diffusion layers of MOS transistors, electrodes of capacitors and lower level wiring, provided below the processing-object film 5.

In step 110, the patterned two-layer photosensitive resin film 25A used as the mask is removed. After that, the patterns of, e.g., the contact-holes and trenches, are filled with a conductive material, such as tungsten, aluminum or copper, or a conductive metal compound, such as titanium nitride, and then the deposited material on the surface of the resultant structure is removed. In this manner, contact plugs and wirings are formed in the object film 5. In the case of the contact plugs, a wiring connected to contact plugs is formed on the processed object film 5. Thus, an interconnection is formed in which the wiring is connected with functional elements of the semiconductor device, such as MOS transistors and lower level wirings, through contact plugs.

Thereafter, necessary steps of forming, for example, multilevel wiring, for the semiconductor device, are executed, thereby completing the semiconductor device.

As described above, the first embodiment can provide a method of forming a pattern on a photosensitive resin film using multiple photosensitive resin layers, a method of forming a pattern for a semiconductor device using the patterned photosensitive resin film, and a method of manufacturing a semiconductor device.

Second Embodiment

A second embodiment of the present invention is directed to a method of forming a pattern on a photosensitive resin film, in which an ion-blocking film is interposed between a patterned photosensitive resin film and processing-object film, a method of forming a pattern for a semiconductor device using the patterned photosensitive resin film, and a method of manufacturing a semiconductor device. The patterned photosensitive resin film uses multiple photosensitive resin layers.

Figure 7:
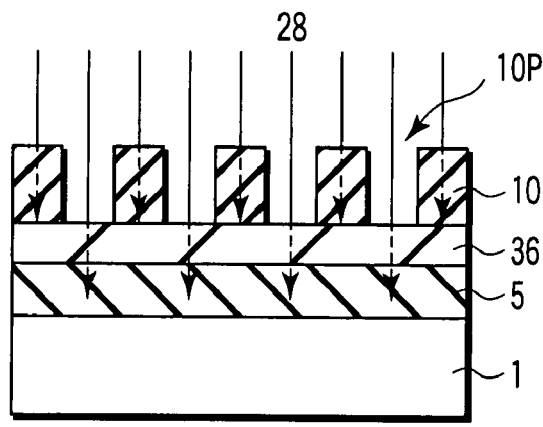
FIG. 7 is a sectional view explaining a problem that occurs in a photosensitive resin film forming method using a bottom anti-reflective coating (BARC) film according to a conventional art.

As described in the first embodiment, increase of acceleration voltage in the ion implantation is effective to make the patterned photosensitive resin film insoluble over its entire thickness. However, the patterned photosensitive resin layer 10, into which ions are implanted, has a pattern 10P as shown in FIG. 7. Accordingly, ions are also implanted into portions of an underlayer that are not covered with photosensitive resin layer 10. In the prior art, the underlayer is, for example, a bottom anti-reflective coating (BARC) film 36 or a processing-object film 5. BARC film 36 is generally thin and is formed of an organic material, and hence generally has a low ion-blocking power. If the processing-object film 5 is a $SiO_2$ film, defects may be caused in the $SiO_2$ film as a result of ion implantation, thereby degrading the characteristics of the $SiO_2$ film, such as an electric breakdown characteristic.

Figure 8:
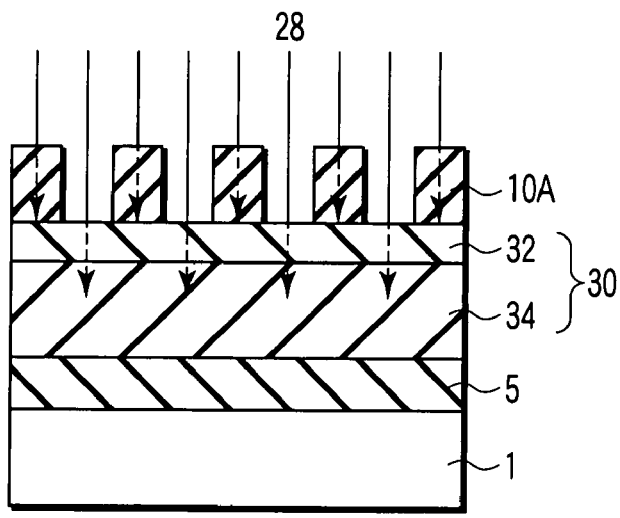
FIG. 8 is a sectional view explaining a method of forming a pattern on a photosensitive resin film, according to a second embodiment of the present invention.

To avoid this, in the second embodiment an ion-blocking film 30 is interposed between the first photosensitive resin layer 10A and the processing-object film 5 as shown in FIG. 8. For example, the ion-blocking film 30 is formed of two layers, which are a spin-on-glass (SOG) film 32 and a spin-on-carbon (SOC) film 34. The thickness of the ion-blocking film 30 is set to a value that enables ions 28, such as $Ar^+$ ions, to stop within the ion-blocking film 30 even when the ions are implanted into the photosensitive resin layer 10 with enough energy to convert it into an insoluble photosensitive resin layer 10A over the entire thickness. By virtue of the ion-blocking film 30, the $Ar^+$ ions 28 do not reach the processing-object film 5 and hence do not degrade the characteristics of the film 5. The ion-blocking film 30 can be formed to also serve as the BARC film. In this case, it is necessary to consider the phase adjustment effect of the ion-blocking film 30 as the BARC film. In light of this, the thickness of the SOG film was fixed at 45 nm. When $Ar^+$ ions are implanted at an acceleration voltage of 100 KV, the sum of the projected range and three times the standard deviation of the projected range, i.e., Rp+3dRp, is 260 nm in the SOC film 34. If the thickness of the SOC film 34 is set to, for example, 300 nm, based on the computation, the $Ar^+$ ions substantially stop within the SOC film 34. In this case, the $Ar^+$ ions do not reach the $SiO_2$ film as the processing-object film 5, and hence the electrical characteristics of the processing-object film 5, e.g., the electric breakdown characteristic of the $SiO_2$ film, is not degraded, and the reliability thereof can be maintained. They are confirmed by experiments. In the experiments, the SOC film and the photosensitive resin layer had similar Rp+3dRp value. This is because the SOC film and the resin layer that happened to be used had similar composition and specific gravity, and hence exhibited similar ion-blocking performance.

When the ion-blocking film 30 also serves as a BARC film, it must have both a reflection preventing function during exposure and an etching mask function having a sufficient selective etching ratio to the photosensitive resin film. The advantage of the two-layer ion-blocking film 30 as the BARC film is that it can increase the selective etching ratio when the BARC film is etched using the patterned photosensitive resin film 25A as a mask. The photosensitive resin layers 10 and 20 and SOC film 34 are organic films, and therefore the selective etching ratio therebetween cannot be set to a high value. In contrast, the selective etching ratio between the photosensitive resin layers 10, 20 and SOG film 32, and that between the SOG film 32 and SOC film 34 can be set to a high value. Accordingly, the thickness of the SOC film 34 can be set to a desired value by interposing the SOG film 32 between the photosensitive resin layer 10 and SOC film 34. Further, the phase adjustment as the BARC film can be realized by optimizing the thickness of the SOG film 32, and the light transmittance can be adjusted by varying the thickness of the SOC film 34. Accordingly, excellent reflection preventing performance can also be achieved.

Since the ion implantation condition is set to a condition for converting the first patterned photosensitive resin layer 10P into the insoluble photosensitive resin layer 10A over the entire thickness, the patterned two-layer photosensitive resin film 25A can be formed without dissolving the lower patterned resist layer 10A.

Figure 9:
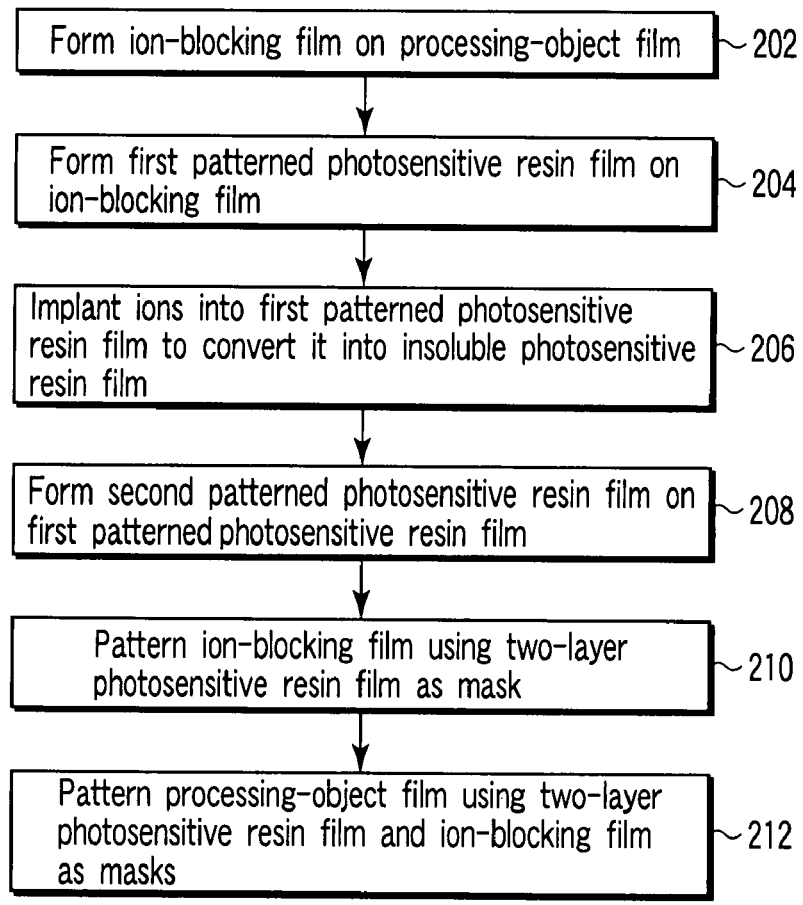
FIG. 9 is a flowchart explaining a method of forming a pattern for a semiconductor device, using a patterned photosensitive resin film produced according to the second embodiment.

Referring then to the flowchart of FIG. 9, a description will be given of a method of forming a pattern for semiconductor device on a processing-object film 5, using the above-described patterned two-layer photosensitive resin film 25A.

In step 202, an ion-blocking film 30 is formed on a processing-object film 5. The processing-object film 5 is, for example, a silicon oxide ($SiO_2$) film and a silicon nitride ($Si_3N_4$) film. The ion-blocking film 30 is, for example, a laminated film of an inorganic film 32, such as a spin-on-glass (SOG) film, and an organic film 34, such as a spin-on-carbon (SOC) film. The inorganic film 32 and organic film 34 have thicknesses of 45 nm and 300 nm, respectively, for example. It is to be noted that the processing-object film 5 is formed to cover at least one of functional elements (not shown) of a semiconductor device, for example, MOS transistors and wirings, provided on/above the semiconductor substrate 1, as in the first embodiment.

In step 204, a first photosensitive resin layer 10 with a pattern 10P, such as contact-holes arranged in a matrix, is provided on the ion-blocking film 30. The first photosensitive resin layer 10 has a thickness of, for example, 150 nm.

In step 206, Ar$^+$ ions 28 are implanted with an acceleration voltage of, for example, 100 KV into the first patterned photosensitive resin layer 10P. When the acceleration voltage of 100 KV is applied, the projected range (Rp) for the Ar$^+$ ions 28 in the photosensitive resin film used in the embodiment is 152 nm. Accordingly, the entire thickness of the first photosensitive resin layer 10 is within the projected range for the Ar$^+$ ions 28, and hence the Ar$^+$ ions 28 are introduced into the first photosensitive resin layer 10 entirely, whereby the entire first photosensitive resin layer 10 is converted into the insoluble photosensitive resin layer 10A. Further, in the hole portions of the patterned photosensitive resin layer 10P, Ar$^+$ ions 28 are implanted into the ion-blocking film 30. The sum (Rp+3dRp) of the projected range for the Ar$^+$ ions 28 in the SOC film 34 and three times the standard deviation of the projected range is 260 nm. Since the thickness of the SOC film 34 is 300 nm, all the Ar$^+$ ions 28 are stopped within the SOC film 34. Accordingly, in the portion exposed by the patterned resin layer 10P, the implanted Ar$^+$ ions 28 are stopped within the ion-blocking film 30, and thus do not reach the processing-object film 5.

In step 208, a second photosensitive resin layer 20 with a selective opening pattern 20P is formed to expose only contact-holes at desired positions, thereby forming a patterned two-layer photosensitive resin film 25A. At the time of forming the second patterned photosensitive resin layer 20P, the entire first photosensitive resin layer 10 is converted into the insoluble photosensitive resin layer 10A by the implantation of the Ar$^+$ ions 28. Therefore, the first patterned photosensitive resin layer 10P is prevented from being dissolved during forming the second patterned photosensitive resin layer 20P.

In step 210, the ion-blocking film 30 is patterned using the patterned two-layer photosensitive resin film 25A as a mask.

In step 212, the processing-object film 5 is etched by, for example, RIE, using both the patterned two-layer photosensitive resin film 25A and ion-blocking film 30 as masks, thereby forming a desired pattern of, for example, contact-holes, in the processing-object film 5.

After that, for example, as in step 110 of the first embodiment shown in FIG. 6, contact plugs are formed in the processed object film 5 by filling the contact-holes with a conductive material, thereby electrically connecting a wiring to be formed thereon with functional elements of the semiconductor device disposed below the object film 5 via the contact plugs.

Thereafter, steps of forming, for example, multi-level wiring, necessary for the semiconductor device, is executed, thereby completing the semiconductor device according to the embodiment.

The embodiment has been described regarding fine contact-hole patterns as an example. It can also be applied to fine trench patterns, such as wiring trenches using multiple photosensitive resin layers. The trench patterns can be used for, e.g., a single- or dual-damascene process for copper wiring. In the case of dual-damascene process, fine trench patterns with contact-holes are formed on a two-layer photosensitive resin film. The first photosensitive resin layer thereof has the contact-hole patterns and the second photosensitive resin layer has trench patterns connected to the contact-hole patterns. The patterned two-layer photosensitive resin film is used as a mask to form trenches with contact-holes in the processing-object film. Thus the trenches with contact-holes for the dual-damascene process can be formed simultaneously.

In the second embodiment, a laminated resist pattern is transferred to the SOG film 32 first, the SOC film 34 is patterned using the SOG film 32 as a mask, and the processing-object film 5, e.g., SiO$_2$ film, is patterned using the SOC film 34 as a mask. Since an oxygen containing gas is used to etch the SOC film 34, the patterned laminated resist 25A is also etched away during etching the SOC film 34. Namely, in the second embodiment, the ion-blocking film 30 is used as a mask for patterning in step 212. Especially, during etching the processing-object film 5, the SOG film 32 is etched along with the processing-object film 5, which means that the SiO$_2$ film as the processing-object film 5 is patterned substantially using the SOC film 34 as a mask.

In contrast, when an organic BARC film is used as the ion-blocking film 30, the ion-blocking film 30 alone cannot be used as a mask for patterning the processing-object film 5. In step 210, only BARC film at the spaces of the patterned resin film 25A is removed. Accordingly, in step 212, the processing-object film 5 is patterned using both the patterned two-layer photosensitive resin film 25A and ion-blocking film 30 as masks.

By virtue of the above steps, a desired pattern can be accurately formed in the processing-object film 5 of the semiconductor device.

The Ar$^+$ ions 28 implanted into the photosensitive resin film to make it insoluble are not implanted into the patterned object film 5 formed of, for example, SiO$_2$. Therefore, the characteristics of SiO$_2$ film, such as electric breakdown, and its reliability are not degraded.

As described above, the embodiments provide a method of forming a pattern on multiple photosensitive resin layers, in which a fine pattern that cannot be formed using a single-layer photosensitive resin film is formed with a sufficient margin, a method of forming a pattern for a semiconductor device, using the resultant fine pattern, and also provide a method of manufacturing a semiconductor device.

The above-described embodiments can be modified in various ways.

In modification 1, a single-layer bottom anti-reflective coating (BARC) film 36 is to be made to have an ion-blocking function, as shown in FIG. 10A. In this case, the thickness of the BARC film 36 is set equal to or thicker than the sum of the projected range for the implanted ions in the BARC film 36 and three times the standard deviation of the projected range, i.e., Rp+3dRp. In general, the thickness of the BARC film 36 is determined from its reflection preventing function. As shown in FIG. 10B, the intensity of reflected light cyclically varies in accordance with the thickness of the BARC film 36. Typically, the BARC film thickness at a trough is selected, with which the intensity of reflected light is low and a change in reflected light intensity due to a change in the BARC film thickness is small. Further, in consideration of the fact that the BARC film 36 must be etched using the photosensitive resin layer 10A as a mask, the BARC film thickness is generally set to the initial trough value. In light of these factors, the thickness of the BARC film 36 in modification 1 is set to the smallest one of the trough values, which is not smaller than Rp+3dRp. Accordingly, if a BARC material that has a large selective etching ratio between the photosensitive resin film 25A and the BARC film 36 is selected, and the BARC film thickness is set to a value that provides a reflection preventing effect and is not smaller than Rp+3dRp, a single-layer BARC film 36 can be used as an ion-blocking film, instead of the two-layer ion-blocking film 30 used in the second embodiment.

In modification 2, an ion-blocking film 38 is provided under a BARC film 36 as shown in FIG. 11A. In this case, a thickness combination of the BARC film 36 and ion-blocking film 38, with which the intensity of reflected light assumes a trough value, is determined in consideration of the intensity of reflected light due the ion-blocking film 38. The thickness of the ion-blocking film 38 is set to a value that enables implanted ions to be stopped within the ion-blocking film 38, by computing the projected range for the ions in the laminated structure of the BARC film 36 and ion-blocking film 38. Further, in consideration of etching properties, a material for the ion-blocking film 38 is selected to have sufficient selective etching ratios between the photosensitive resin layers 10 and 20 and BARC film 36, between the BARC film 36 and ion-blocking film 38, and between the ion-blocking film 38 and processing-object film 5 formed of, for example, $SiO_2$.

In modification 3 in which a pattern that does not require BARC film is formed, only a single-layer ion-blocking film 38 is interposed between the photosensitive resin layer 10 and processing-object film 5, as shown in FIG. 11B. In this case, the thickness of the ion-blocking film 38 is set to a value not smaller than Rp+3dRp in the ion-blocking film 38, in light of the projected range (Rp) for the implanted ions 28.

Since the projected range for ions depends upon the material into which the ions are implanted, Rp and dRp varies in accordance with the material of the ion-blocking film.

Although in each of the above-described embodiments, a method of forming a pattern on a photosensitive resin film has been described using a PAC process as an example, it is not limited to this process. The invention is directed to a method, in which a multi-layer patterned photosensitive resin film is used, to convert a first patterned photosensitive resin layer into an insoluble photosensitive resin layer before another photosensitive resin layer is stacked on the first patterned photosensitive resin layer, and hence can be applied to other pattern-forming processes.

In modification 4, line-and-space patterned photosensitive resin films 10 and 20, which have patterns perpendicular to each other, are stacked on each other to form a patterned film with openings arranged in a matrix, as in a plane view shown in FIG. 12. In this case, after a first photosensitive resin layer 10 with one line-and-space pattern is formed, the resultant first patterned photosensitive resin layer 10 is converted into an insoluble photosensitive resin layer 10A by implantation of ions. Then a second photosensitive resin layer 20 with another line-and-space pattern is formed on the first photosensitive resin layer 10A.

The invention is also applicable to a method of forming a contact-hole pattern in which contact-holes are densely arranged in a certain direction and isolated in other direction. In this case, a densely line-and-space pattern is formed on a first photosensitive resin layer, and isolated spaces are selected by a second photosensitive resin layer. This method is advantageous in that it can form a finer pattern with a greater margin than a method of forming a fine pattern using a single photosensitive resin film.

The invention is further applicable to a method of forming a lower patterned photosensitive resin layer with a periodic line-and-space pattern using Levenson mask, and then forming an upper photosensitive resin layer with an isolated-space pattern that covers unnecessary portions of the lower patterned layer. In this case, the lower periodic line-and-space patterned layer is converted into an insoluble photosensitive resin layer by the method described above.

Various computation methods for computing the projected range for implanted ions are known, and can be available in the invention. For instance, a method of approximating a distribution of projected ranges for ions by a Gaussian distribution, or a method utilizing Monte Carlo simulation. Using the projected ranges computed by such a method, ion implantation conditions for converting a photosensitive resin film into an insoluble one are determined, or the thickness of an ion-blocking film can be determined.

Further, when the software to calculate the projected range for ions is prepared, the conditions of ion implantation can be easily acquired by inputting the species of ions used, and the materials and structures of the stacked films, such as photosensitive resin films, bottom anti-reflective coating film and ion-blocking film.

An ion-implanting apparatus employed in the invention can be made to have a smaller number of functions than conventional apparatuses for implanting dopants into a semiconductor substrate. The conventional ion-implanting apparatus generally comprises an ion source for generating ions, a mass analyzer for selecting desired ones from the generated ions, an accelerator for accelerating the ions, a scanner for uniformly implanting the ions into substrates, and an end station for placing therein the substrates. It also requires a toxic substance treatment system, depending upon the ions used. However, for the purpose of converting a photosensitive resin film into an insoluble one, the species of ion is limited to inert gas that do not contained in photosensitive resin film, such as $He^+$, $Ar^+$, $Xe^+$ and $Kr^+$. Moreover, it is sufficient if only one of these ion species is used, and an ion source for an inert gas alone is employed. Accordingly, a toxic substance treatment system that is necessary depending upon the ions used is not required. Further, if the ion species used is fixed, the mass analyzer for selecting ions is not necessary, either. As a result, a cost-effective ion-implanting apparatus of a simplified structure can be used. Furthermore, if the above-mentioned ions' projected range computation software is installed in the ion-implanting apparatus, ion implantation conditions can be easily determined and ion implantation can be performed easily.

As described above, the present invention provides a method of forming a pattern on multiple photosensitive resin (resist) layers, in which a fine pattern that cannot be formed using a single-layer photosensitive resin film is formed with a sufficient margin, and provides a method of forming a pattern for a semiconductor device using the resultant fine pattern, and also provide a method of manufacturing a semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern on a photosensitive resin film, comprising:

forming a processing-object film above a semiconductor substrate;

forming a first patterned photosensitive resin layer on the processing-object film;

implanting ions into the first patterned photosensitive resin layer, the sum (Rp+3dRp) of a projected range (Rp) for the ions in the first photosensitive resin layer and three times a standard deviation (dRp) of the projected range being greater than a thickness of the first patterned photosensitive resin layer; and forming a second patterned photosensitive resin layer on the ion-implanted first patterned photosensitive resin layer.

2. The method according to claim 1, wherein the projected range for the ions in the first photosensitive resin layer is greater than the thickness of the first patterned photosensitive resin layer.

3. The method according to claim 1, wherein a species of the ions is one selected from the group of helium, argon, xenon, and krypton.

4. The method according to claim 1, wherein the projected range for the ions in the first photosensitive resin layer and the standard deviation of the projected range are controlled by adjusting an acceleration voltage during implantation of the ions.

5. A method of forming a pattern on a photosensitive resin film, comprising:
   forming a processing-object film above a semiconductor substrate;
   forming an ion-blocking film on the processing-object film;
   forming a first patterned photosensitive resin layer on the ion-blocking film;
   implanting ions into the first patterned photosensitive resin layer and the ion-blocking film, the sum (Rp+3dRp) of a projected range (Rp) for the ions in the first photosensitive resin layer and three times a standard deviation (dRp) of the projected range being greater than a thickness of the first patterned photosensitive resin layer; and
   forming a second patterned photosensitive resin layer on the ion-implanted first patterned photosensitive resin layer.

6. The method according to claim 5, wherein the thickness of the ion-blocking film is greater than the sum (Rp+3dRp) of a projected range (Rp) for the ions in the ion-blocking film and three times a standard deviation (dRp) of the projected range in the ion-blocking film.

7. The method according to claim 5, wherein the ion-blocking film is a bottom anti-reflective coating film.

8. The method according to claim 7, wherein the ion-blocking film includes one or more film layers.

9. The method according to claim 8, wherein the ion-blocking film is a laminated layer of a spin-on-glass film and a spin-on-carbon film.

10. The method according to claim 9, wherein the spin-on-carbon film has a thickness greater than the sum (Rp+3dRp) of a projected range (Rp) for the ions in the spin-on-carbon film and three times a standard deviation (dRp) of the projected range in the spin-on-carbon film.

11. The method according to claim 5, wherein a species of the ions is one selected from the group of helium, argon, xenon, and krypton.

12. The method according to claim 5, wherein the projected range for the ions in the first photosensitive resin layer and the standard deviation of the projected range are controlled by adjusting an acceleration voltage during implantation of the ions.

13. A method of forming a pattern for a semiconductor device comprising:
   forming a processing-object film above a semiconductor substrate;
   forming a first patterned photosensitive resin layer on the processing-object film;
   implanting ions into the first patterned photosensitive resin layer, the sum (Rp+3dRp) of a projected range (Rp) for the ions in the first photosensitive resin layer and three times a standard deviation (dRp) of the projected range being greater than a thickness of the first patterned photosensitive resin layer;
   forming a second patterned photosensitive resin layer on the ion-implanted first patterned photosensitive resin layer; and
   patterning the processing-object film using the first and second patterned photosensitive resin layers as masks.

14. The method according to claim 13, wherein the projected range for the ions in the first photosensitive resin layer is greater than the thickness of the first patterned photosensitive resin layer.

15. The method according to claim 13, further comprising:
   forming an ion-blocking film on the processing-object film,
   wherein the first patterned photosensitive resin layer is formed on the ion-blocking film, and the ions are implanted into the ion-blocking film, and
   wherein the ion-blocking film has a thickness greater than the sum (Rp+3dRp) of a projected range (Rp) for the ions in the ion-blocking film and three times a standard deviation (dRp) of the projected range in the ion-blocking film.

16. The method according to claim 15, wherein the patterning the processing-object film includes
   patterning the ion-blocking film using the first and second photosensitive resin layers as masks, and
   patterning the processing-object film using at least the ion-blocking film as a mask.

17. The method according to claim 15, wherein the ion-blocking film is a bottom anti-reflective coating film.

18. The method according to claim 17, wherein the ion-blocking film is a laminated layer of a spin-on-glass film and a spin-on-carbon film.

19. The method according to claim 13, wherein a species of the ions is one selected from the group of helium, argon, xenon and krypton.

20. A method of manufacturing a semiconductor device, comprising:
   forming functional elements of the semiconductor device on and/or above a semiconductor substrate;
   forming a processing-object film over the functional elements;
   forming a first patterned photosensitive resin layer on the processing-object film;
   implanting ions into the first patterned photosensitive resin layer, the sum (Rp+3dRp) of a projected range (Rp) for the ions in the first photosensitive resin layer and three times a standard deviation (dRp) of the projected range being greater than a thickness of the first patterned photosensitive resin layer;
   forming a second patterned photosensitive resin layer on the ion-implanted first patterned photosensitive resin layer;
   forming holes and/or trenches in the processing-object film using the first and second patterned photosensitive resin layers as masks, the holes and/or trenches reaching the functional elements; and
   forming conductive materials in the holes and/or trenches, thereby electrically connecting the conductive materials to the functional elements.

* * * * *